United States Patent [19]

North

[11] Patent Number: 5,218,022
[45] Date of Patent: Jun. 8, 1993

[54] PROTECTIVE COATING FOR AN ELECTRICAL OR ELECTRONIC CIRCUIT

[76] Inventor: Neil A. North, 89 Bywater Way, Wilson Western Australia, 6107, Australia

[21] Appl. No.: 391,160

[22] Filed: Aug. 8, 1989

[30] Foreign Application Priority Data

Aug. 9, 1988 [AU] Australia ................. PI9738

[51] Int. Cl.$^5$ .............................................. C08K 5/34
[52] U.S. Cl. ..................... 524/86; 106/14.05; 427/58; 524/379; 524/390; 524/557; 525/61; 525/375
[58] Field of Search ............ 427/58; 106/14.05; 524/557, 86, 379, 390; 525/61, 375

[56] References Cited

U.S. PATENT DOCUMENTS

| | | | |
|---|---|---|---|
| 3,392,130 | 7/1968 | Rucker et al. | 524/557 X |
| 3,393,172 | 7/1968 | Breskman | 524/557 X |
| 3,441,361 | 4/1969 | Tocatlian | 8/4 |
| 3,515,585 | 6/1970 | Chamberlin et al. | 117/212 |
| 3,951,882 | 4/1976 | Markhart et al. | 524/557 X |
| 4,098,749 | 7/1978 | Hoshino et al. | 524/557 X |
| 4,111,884 | 9/1978 | Takase et al. | 524/557 X |
| 4,126,597 | 11/1978 | Walrath et al. | 525/61 X |
| 4,172,187 | 10/1979 | Fabel | 525/61 |
| 4,210,564 | 7/1980 | Pouchol | 524/557 |
| 4,238,528 | 12/1980 | Angelo et al. | 427/96 |
| 4,499,236 | 2/1985 | Hermann et al. | 525/61 X |
| 4,510,276 | 4/1985 | Leech et al. | 523/427 |
| 4,698,240 | 10/1987 | Ono et al. | 427/58 |
| 4,792,464 | 12/1988 | Martenson | 427/156 |

FOREIGN PATENT DOCUMENTS

| | | |
|---|---|---|
| 428835 | 4/1969 | Australia . |
| 60219268 | 11/1981 | Japan . |
| 56140050 | 4/1984 | Japan . |

OTHER PUBLICATIONS

Patent abstracts of Japan JP 62-280736, Dec. 5, 1987.
Derwent abstracts Accession No. 88-178186/26, May 19, 1988.
Article in "Electronic Recharging and Production Volume" vol. 26 No. 2 entitled Coatings Over High--Volume PCBs, Feb. 1986.

Primary Examiner—Joseph L. Schofer
Assistant Examiner—J. M. Reddick
Attorney, Agent, or Firm—Klein & Szekeres

[57] ABSTRACT

The present invention relates to a protective coating composition for electrical or electronic circuits containing a curable polyvinyl acetal polymer and a non-ionic corrosion inhibitor such as an azole. The invention also relates to a method of protectively coating electrical or electronic circuits.

8 Claims, No Drawings

PROTECTIVE COATING FOR AN ELECTRICAL OR ELECTRONIC CIRCUIT

FIELD OF THE INVENTION

The present invention relates to a protective coating for an electrical or electronic circuit.

BACKGROUND OF THE INVENTION

In recent years there has been an ever increasing application of electronics circuits in equipment used in aggressive environments and high damage risk areas. This includes for example a wide variety of electronic navigation and communication equipment on ships and small boats, monitoring and analysis equipment in mines and factories, telecommunication equipment in outdoor locations, small computers in field and un-airconditioned environments. A frequent cause of failure of this equipment is related to water, water based solutions, salts and reactive gases coming into contact with the components of electronic circuits. When this occurs the damage can be either immediate (as in the case of salt solutions producing short circuits between components) or gradual (as in the case of corrosion attack on the metallic components).

Thus, it is desirable to provide some form of protection. Such protection may typically be in the form of a coating. The coating should preferably form a thin film on the components and thus minimize reductions in heat transfer from the components to the air. If heat transfer is not adequate the components may become overheated and fail. The coating should preferably be transparent so all components may be readily identified.

It is desirable that the coating dry rapidly so as to minimize any delay between coating and returning a circuit to service in field application, and to minimize production time in factory application.

The coating should preferably also dry to a hard, glossy film. A hard glossy film is desirable since it reduces the tendency of foreign particles, for example, dust, dirt and wind blown salt to adhere subsequently to the surface where they could cause damage through short circuiting or assisting corrosion.

The coating should preferably be readily removable so that soldering of the circuits is not prevented or impaired. When cured, the coating should preferably not have any tendency to spread over uncoated areas where the formation of an insulating layer could interfere with the operation of components.

OBJECTS OF THE INVENTION

The present invention provides a coating composition which can be used to apply a water and gas resistant, electrically insulating coating to an electrical or electronic circuit and in which one or more of the above objects is achieved. The coating produced by the present invention needs to be gas resistant because of the possibility of the existence of aggressive gases in the atmosphere such as water vapor, oxygen and acid fumes.

SUMMARY OF THE INVENTION

In accordance with one aspect of the present invention there is provided a protective coating composition for electrical and/or electronic circuits comprising a mixture of a curable polyvinyl acetal polymer in which each acetal group contains from 1 to 5 carbon atoms, and a non ionic corrosion inhibitor dissolved in an organic solvent to form a solution.

In accordance with a further aspect of the present invention there is provided a method of protectively coating electrical or electronic circuits which comprises applying to an electrical or electronic circuit a composition comprising a mixture of a curable polyvinyl acetal polymer in which each acetal group contains from 1 to 5 carbon atoms, and a non ionic corrosion inhibitor dissolved in an organic solvent to form a solution, allowing the solvent to evaporate and the polymer to cure so as to form a coating on the electrical or electronic circuit.

The non ionic corrosion inhibitor is included in the composition and method of the present invention because some transmission of water vapor through the cured coating is inevitable especially with a thin film. The corrosion inhibitor incorporated in the film prevents transmitted water vapor from causing corrosion attack on metal surfaces of the electrical or electronic circuit.

The composition of the present invention may be applied in accordance with the method of the present invention by known techniques such as by brushing, dipping or spraying The non-ionic corrosion inhibitor is primarily effective in providing protection for copper and copper alloys but a degree of corrosion protection may also be afforded for other metals.

Preferably, the corrosion inhibitor is sufficiently volatile in the temperature range from 0 to 60 degrees Celsius so as to provide vapor phase protection at any gaps or breaks in the coating. Examples of such corrosion inhibitors are ones containing an azole group such as benzotriazole or tolyltriazole.

Preferably, the solvent is a low molecular weight monohydroxy alcohol typically containing from 1 to 5 carbon atoms or admixtures of the same. Examples of such alcohols are ethanol, iso-propanol, methanol and n-butanol. The alcohol is important as a primary solvent and the components of the composition need to be dissolved in the alcohol component first. However, the solvent may also contain aromatic hydrocarbon in an amount up to 75% by volume. Suitable aromatic hydrocarbons are xylene and toluene. In particular, in the present invention there is no need to use environmentally undesirable solvents such as chlorofluorocarbons.

The composition of the present invention preferably contains from 40 to 170 grams of the polyvinyl acetal per liter of composition.

Preferably, the solvent will evaporate without leaving a residue.

Preferably, the solvent contains less than 5% by weight of water. The polyvinyl acetal polymer used in the present invention is preferably polyvinylbutyral and derivatives thereof. For example, the polyvinylacetal polymers may contain up to 30% of vinyl alcohol or vinyl acetate units, preferably between 15 and 25% of vinyl alcohol or vinyl acetate units. The polyvinyl acetal preferably has a molecular weight in the range from 25,000 to 200,000; more preferably in the range from 35,000 to 50,000.

Preferably, the polymer is a solid non-tacky resin at temperatures of up to 30 degrees C.

Preferably, the polymer is soluble in the solvent to at least 4% between 0 degrees C. and 40 degrees C.

The polymer used may be purely a polyvinyl acetal containing polymer or it may contain up to 30% by weight of other vinyl polymers.

The polyvinyl polymers, especially polyvinyl butyral exhibit good adhesion and good flexibility in formation of H coatings and do not require heating for curing.

Preferably, the corrosion inhibitor is soluble in the solvent to at least 0.2% between 0 degrees C. and 40 degrees C. The corrosion inhibitor is preferably used in a concentration between 1:5 and 1:20 by weight of the polyvinyl acetal.

Preferably, the azole inhibitor should have sufficient volatility to provide some degree of corrosion protection to copper alloys in enclosed containers.

Preferably, the melting point of the corrosion inhibitor should be above 30 degrees C.

EXAMPLES

The present invention will now be described, by way of example, with reference to the following examples. The polyvinyl butyral used in the following examples was Union Carbide grade XYHL, a copolymer containing 80.7 % vinyl butyral resin, 19% vinyl alcohol resin and 0.3% vinyl acetate resin and having a molecular weight in the range from 38000 to 45000.

EXAMPLE 1

A solution was prepared by dissolving 10 grams of benzotriazole in 1000 mls of iso-propanol. To this solution was added 100 grams of polyvinyl butyral resin and the mixture was stirred until dissolution was complete. One thousand grams of toluene was then added to the solution with stirring to produce the final composition in accordance with the present invention. The solution was then applied by dipping to an electrical circuit and the solvent allowed to evaporate and the resin to cure.

When treating circuit boards or equipment, any surfaces which are not to be coated should be masked or otherwise protected against coating.

For increased protection, application of at least two coats is preferred.

EXAMPLE 2

Benzotriazole and polyvinyl butyral were dissolved in industrial ethanol to form a solution of 92.8% industrial ethanol, 6.0% polyvinylbutyral and 1.2% benzotriazole. The percentages quoted are by weight of the final solution. The solution was then applied by dipping to an electrical circuit, the solvent allowed to evaporate and the resin to cure.

EXAMPLE 3

Benzotriazole and polyvinylbutyral were dissolved in a mixture of industrial ethanol and iso-propanol to form a solution of 59.5% industrial ethanol, 35.0% iso-propanol, 5.0% polyvinylbutyral and 0.5% benzotriazole.

The percentages quoted are by weight of the final solution. The solution was ten applied to an electrical circuit by dipping and the solvent allowed to evaporate and the resin allowed to cure.

TEST RESULTS

To test the effectiveness of the solution three identical new manufactured circuit boards were selected. The circuit boards used were from atomic absorption machines, and were of a type which had previously shown frequent failures under operational conditions. The treatment applied to the boards was as follows:

Board 1. No treatment - control.

Board 2. Two coats of Example 3 prepared as described above but omitting the benzotriazole from the composition. Coats were applied by dipping, allowing 15 minutes drying time between coats.

Board 3 Two coats of Example 3 prepared as described above.

Coats were applied by dipping, with 15 minutes drying time allowed between coats.

The three boards were placed in an acid/solvent/saline vapor environment for 21 days and then evaluated. Results were as follows:

|  | Board 1 | Board 2 | Board 3 |
| --- | --- | --- | --- |
| Appearance | Extensive Corrosion Attack | Isolated Spots Corrosion Attack | No corrosion Attack |
| Machine Test | Non-functional | Non-functional | Operational |

A dye may be incorporated in the composition of the present invention.

The dye should be soluble in alcohol and non-ionic.

Further, the dye should not be added in such quantities that it produces a significant deterioration in the protective properties of the cured film.

A dye may be useful to provide colour identification of either or both the solution and/or the applied film. Where required, the cured coatings can be removed from electrical circuits by cleaning the circuits with industrial ethanol or similar alcohol solvents. Any residual coating remaining is not envisaged to prevent subsequent soldering.

What is claimed is:

1. A protective coating composition for electrical or electronic circuits consisting essentially of a mixture of a acetal polymer in which each acetal group contains from 1 to 5 carbon atoms, and an azole substituted aromatic non-ionic corrosion inhibitor dissolved in an essentially water free liquid organic solvent to form a solution, the organic solvent being capable of evaporation without leaving a residue, wherein at least 25% of the total volume of the organic solvent is lower molecular weight monohydroxy alcohol containing 1–5 carbon atoms and the balance, if any, is aromatic hydrocarbon.

2. The protective coating composition according to claim 1 which contains from 40 to 170 grams of the polyvinyl acetal per liter of the composition.

3. The protective coating composition according to claim 1 in which the polyvinyl acetal contains up to 30% of polyvinyl alcohol or polyvinyl acetate units.

4. The protective coating composition according to claim 1, in which the polyvinyl acetal polymer has a molecular weight in the range from 25000 to 200000.

5. The protective coating composition according to claim 4, in which the polyvinyl acetal has a molecular weight in the range from 35000 to 50000.

6. The protective coating composition according to claim 1, in which the corrosion inhibitor is benzotriazole or tolyltriazole.

7. The protective coating composition according to claim 1, in which the corrosion inhibitor is present in an amount from 1:5 to 1:20 by weight of the polyvinyl acetal.

8. The protective coating composition according to claim 1, in which the azole substituted aromatic non-ionic corrosion inhibitor is sufficiently volatile so as to provide vapor phase protection of any gaps or breaks in the coating.

* * * * *